United States Patent
Yang et al.

(10) Patent No.: US 11,590,456 B2
(45) Date of Patent: Feb. 28, 2023

(54) SYSTEMS AND METHODS FOR OLEOPHOBIC COMPOSITE MEMBRANES

(71) Applicant: UCHICAGO ARGONNE, LLC, Chicago, IL (US)

(72) Inventors: Hao-Cheng Yang, Westmont, IL (US); Seth B. Darling, Chicago, IL (US); Jeffrey W. Elam, Elmhurst, IL (US); Lin Chen, Westmont, IL (US); Ruben Waldman, Chicago, IL (US)

(73) Assignees: UChicago Argonne, LLC, Chicago, IL (US); The University of Chicago, Chicago, IL (US)

(*) Notice: Subject to any disclaimer, the term of this patent is extended or adjusted under 35 U.S.C. 154(b) by 0 days.

(21) Appl. No.: 15/994,825

(22) Filed: May 31, 2018

(65) Prior Publication Data

US 2019/0366273 A1    Dec. 5, 2019

(51) Int. Cl.
*B01D 67/00* (2006.01)
*B01D 69/02* (2006.01)
*B01D 71/34* (2006.01)
*C23C 16/40* (2006.01)
*C23C 16/455* (2006.01)

(52) U.S. Cl.
CPC ......... B01D 67/0037 (2013.01); B01D 69/02 (2013.01); B01D 71/34 (2013.01); *B01D 2323/02* (2013.01); *B01D 2323/36* (2013.01); *B01D 2325/36* (2013.01); *C23C 16/402* (2013.01); *C23C 16/405* (2013.01); *C23C 16/407* (2013.01); *C23C 16/45527* (2013.01); *C23C 16/45555* (2013.01)

(58) Field of Classification Search
CPC ............ B01D 67/0037; B01D 67/0072; B01D 60/02; C23C 16/402; C23C 16/405; C23C 16/407; C23C 16/45527; C23C 16/45555
See application file for complete search history.

(56) References Cited

U.S. PATENT DOCUMENTS

| | | |
|---|---|---|
| 3,617,552 A | 11/1971 | Will et al. |
| 4,744,889 A | 5/1988 | Kruyer |
| 4,889,542 A | 12/1989 | Hayes |
| 5,133,881 A | 7/1992 | Miller et al. |
| 5,645,733 A | 7/1997 | Hobson |
| 5,973,068 A | 10/1999 | Yamaya et al. |
| 6,326,326 B1 | 12/2001 | Feng et al. |
| 6,723,595 B2 | 4/2004 | Park |
| 8,980,418 B2 | 3/2015 | Darling et al. |
| 9,103,086 B2 | 8/2015 | Cantrell et al. |

(Continued)

FOREIGN PATENT DOCUMENTS

| | | |
|---|---|---|
| WO | WO-2006/033924 | 3/2006 |
| WO | WO-2011/138583 A1 | 11/2011 |
| WO | WO-2015/076438 A1 | 5/2015 |

OTHER PUBLICATIONS

"Oleo Sponge," Argonne National Laboratory, 1 page (2018).

(Continued)

*Primary Examiner* — Joseph A Miller, Jr.
(74) *Attorney, Agent, or Firm* — Foley & Lardner LLP

(57) ABSTRACT

Atomic layer deposition is utilized to deposit a coating on a membrane. The coated membrane exhibits a tightly bound hydration layer upon exposure to water. The resultant coated membrane is oleophobic.

11 Claims, 7 Drawing Sheets

(56) References Cited

U.S. PATENT DOCUMENTS

| | | | |
|---|---|---|---|
| 9,719,226 | B2 | 8/2017 | Riedel |
| 2002/0005360 | A1* | 1/2002 | Haug ................ C25B 11/0478 |
| | | | 205/340 |
| 2002/0043216 | A1 | 4/2002 | Hwang et al. |
| 2002/0144595 | A1* | 10/2002 | Wang ................ B01D 39/1692 |
| | | | 95/46 |
| 2003/0082412 | A1* | 5/2003 | Fukuda ............. H01J 37/32532 |
| | | | 428/697 |
| 2005/0081907 | A1* | 4/2005 | Lewis ..................... C23C 18/08 |
| | | | 136/243 |
| 2006/0048938 | A1 | 3/2006 | Kalman |
| 2006/0088666 | A1 | 4/2006 | Kobrin et al. |
| 2008/0073288 | A1 | 3/2008 | Fan et al. |
| 2008/0107809 | A1 | 5/2008 | Wu et al. |
| 2008/0286448 | A1* | 11/2008 | Elam ..................... C23C 16/407 |
| | | | 427/109 |
| 2009/0111703 | A1 | 4/2009 | Gopalan |
| 2009/0297868 | A1* | 12/2009 | Ito ....................... H01L 51/0533 |
| | | | 428/447 |
| 2009/0304920 | A1 | 12/2009 | Elam et al. |
| 2010/0003406 | A1 | 1/2010 | Lam et al. |
| 2010/0080903 | A1 | 4/2010 | Tamitsuji et al. |
| 2011/0042301 | A1 | 2/2011 | Zhang et al. |
| 2011/0056886 | A1 | 3/2011 | De Luca |
| 2011/0168454 | A1 | 7/2011 | Keshavan et al. |
| 2012/0046421 | A1 | 2/2012 | Darling et al. |
| 2012/0171403 | A1* | 7/2012 | Dodge ............. C23C 16/45555 |
| | | | 428/36.1 |
| 2013/0059123 | A1 | 3/2013 | Wang et al. |
| 2013/0095996 | A1 | 4/2013 | Buelow et al. |
| 2014/0370259 | A1* | 12/2014 | Edwards ............... C23C 18/165 |
| | | | 428/216 |
| 2014/0371060 | A1 | 12/2014 | Smith et al. |
| 2017/0025658 | A1 | 1/2017 | Shi et al. |
| 2017/0157534 | A1 | 6/2017 | Curtis et al. |
| 2017/0166456 | A1 | 6/2017 | Darling et al. |
| 2017/0304778 | A1 | 10/2017 | Ye et al. |
| 2020/0062600 | A1 | 2/2020 | Kidambi et al. |

OTHER PUBLICATIONS

Barry, et al., "Advanced oil sorbents using sequential infiltration synthesis," Journal of Materials Chemistry A 5(6), pp. 2929-2935 (2017).

Bico, et al., "Wetting of textured surfaces," Colloids and Surfaces A: Physicochemical and Engineering Aspects 206(1-3), pp. 41-46 (2002).

Bobji, et al., "Underwater sustainability of the 'Cassie' state of wetting," Langmuir 25(20), pp. 12120-12126 (2009).

Buluswar, et al., "50 Breakthroughs: Critical scientific and technological advances needed for sustainable global development," Institute for Transformative Technologies, Lawrence Berkeley National Lab., 22 pages (2014).

Calcagnile, et al., "Magnetically Driven Floating Foams for the Removal of Oil Contaminants from Water," ACS Nano 6(6), pp. 5413-5419 (2012).

Cao, et al., "Hydrophobic/Hydrophilic Cooperative Janus System for Enhancement of Fog Collection," Small 11(34), pp. 4379-4384 (2015).

Chen, et al., "Enhancing the hydrophilicity and water permeability of polypropylene membranes by nitric acid activation and metal oxide deposition," Journal of Membrane Science 487, pp. 109-116 (2015).

Choi, et al., "Effects of substrate conductivity on cell morphogenesis and proliferation using tailored, atomic layer deposition-grown ZnO thin films," Scientific Reports 5, 9974, 9 pages (2015).

Dillon, et al., "Surface chemistry of Al2O3 deposition using Al(CH3)3 and H2O in a binary reaction sequence," Surface Science 322 (1-3), pp. 230-242 (1995).

Dorrer & Ruhe, "Superaerophobicity: Repellence of air bubbles from submerged, surface-engineered silicon substrates," Langmuir 28(42), pp. 14968-14973 (2012).

Elam, et al., "Conformal coating on ultrahigh-aspect-ratio nanopores of anodic alumina by atomic layer deposition," Chemistry of Materials 15(18), pp. 3507-3517 (2003).

Elam, et al., "Spatially controlled atomic layer deposition in porous materials," Applied Physics Letters 91, pp. 177-184 (2007).

Fabreguette, et al., "Quartz crystal microbalance study of tungsten atomic layer deposition using WF6 and Si2H6," Thin Solid Films 488(1-2), pp. 103-110 (2005).

Frackowiak & Beguin, "Carbon materials for the electrochemical storage of energy in capacitors," Carbon 39(6), pp. 937-950 (2011).

Ge, et al., "Pumping through Porous Hydrophobic/Oleophilic Materials: An Alternative Technology for Oil Spill Remediation," Angewandte Chemie 53(14), pp. 3612-3616 (2014).

George, "Atomic layer deposition: an overview," Chemical Reviews 110(1), pp. 111-131 (2010).

Hall, et al., "Energy storage in electrochemical capacitors: designing functional materials to improve performance," Energy & Environmental Science 3, pp. 1238-1251 (2010).

Hao, et al., "Oxygen Vacancies Lead to Loss of Domain Order, Particle Fracture, and Rapid Capacity Fade in Lithium Manganospinel (LiMn2O4) Batteries," ACS Applied Materials & Interfaces 6(14), pp. 10849-10857 (2014).

Hou, et al., "Biocatalytic Janus membranes for CO2 removal utilizing carbonic anhydrase," Journal of Materials Chemistry A 3, pp. 17032-17041 (2015).

Hu, et al,. "An ultrathin bilayer membrane with asymmetric wettability for pressure responsive oil/water emulsion separation," J. Mater. Chem. A, 3, pp. 23477-23482 (2015).

Huang, et al., "Novel Janus Membrane for Membrane Distillation with Simultaneous Fouling and Wetting Resistance," Environmental Sciences Technology 51(22), pp. 13304-13310 (2017).

International Search Report and Written Opinion for PCT/US2017/041223 dated Sep. 28, 2017, 8 pages.

Janotti & Van De Walle, "Fundamentals of zinc oxide as a semiconductor," Reports on Progress in Physics 72(12), 29 pages (2009).

Jung, et al., "Improved functionality of lithium-ion batteries enabled by atomic layer deposition on the porous microstructure of polymer separators and coating electrodes," Advanced Energy Materials 2(8), pp. 1022-1027 (2012).

Jur, et al., "Temperature-dependent subsurface growth during atomic layer deposition on polypropylene and cellulose fibers," Langmuir 26(11), pp. 8239-8244 (2010).

Keshavarz, et al., "Enhancing oil removal from water by immobilizing multi-wall carbon nanotubes on the surface of polyurethane foam," Journal of Environmental Management 157, pp. 279-286 (2015).

Kim, et al., "A development of high power activated carbon using the KOH activation of soft carbon series cokes," Transactions on Electrical and Electronic Materials 15(2), pp. 81-86 (2014).

Lam, et al., "A Chemically Patterned Microfluidic Paper-based Analytical Device (C-uPAD) for Point-of-Care Diagnostics," Scientific Reports 7, 1188, 10 pages (2017).

Lee, et al., "An Alternative Route Towards Metal-Polymer Hybrid Materials Prepared by Vapor-Phase Processing," Advanced Functional Materials 21(16), pp. 3047-3055 (2011).

Lee, et al., "Conformal Nitrogen-Doped TiO2 Photocatalytic Coatings for Sunlight-Activated Membranes," Advanced Sustainable Systems 1(1-2), 1600041, 23 pages (2017).

Lee, et al., "Nanofluidic transport governed by the liquid/vapour interface," Nature Nanotechnology 9, pp. 317-323 (2014).

Li, et al., "Modification of ceramic membranes for pore structure tailoring: The atomic layer deposition route," Journal of Membrane Science 397-398, pp. 17-23 (2012).

Li, et al., "Precise pore size tuning and surface modifications of polymeric membranes using the atomic layer deposition technique," Journal of Membrane Science 385-386, pp. 1-9 (2011).

Li, et al., "Under-Water Superaerophobic Pine-Shaped Pt Nanoarray Electrode for Ultrahigh-Performance Hydrogen Evolution," Advanced Functional Materials 25(11), pp. 1737-1744 (2015).

MacDiarmid, et al., "Polyaniline: a new concept in conducting polymers," Synthetic Metals 18(1-3), pp. 285-290 (1987).

(56) References Cited

OTHER PUBLICATIONS

McNeill, et al., "Electronic Conduction in Polymers. I. The Chemical Structure of Polypyrrole," Australian Journal of Chemistry 16(6), pp. 1056-1075 (1963).
Naveen, et al., "Applications of conducting polymer composites to electrochemical sensors: A review," Applied Materials Today 9, pp. 419-433 (2017).
Oh, et al., "Janus-Faced, Dual-Conductive/Chemically Active Battery Separator Membranes," Advanced Functional Materials 26(39), pp. 7074-7083 (2016).
Ozkaya, et al., "Combined in situ XPS and UHV-chemical force microscopy (CFM) studies of the plasma induced surface oxidation of polypropylene," Plasma Processes and Polymers 11(3), pp. 256-262 (2014).
Parsons, et al., "Mechanisms and reactions during atomic layer deposition on polymers," Coordination Chemistry Reviews 257 (23-24), pp. 3323-3331 (2013).
Pasta, et al., "A Desalination Battery," Nano Letters 12(2), pp. 839-843 (2012).
Peng, et al., "Janus separator of polypropylene-supported cellular graphene framework for sulfur cathodes with high utilization in lithium-sulfur batteries," Advanced Science 3(1), pp. 1-11 (2015).
Peng, et al., "Theoretical specific capacitance based on charge storage mechanisms of conducting polymers: Comment on 'Vertically oriented arrays of polyaniline nanorods and their super electrochemical properties'," Chemical Communications 47, pp. 4105-4107 (2011).
Pi, et al., "Polypropylene microfiltration membranes modified with TiO2 nanoparticles for surface wettability and antifouling property," Journal of Membrane Science 500, pp. 8-15 (2016).
Porada, et al., "Review on the science and technology of water desalination by capacitive deionization," Progress in Materials Science 58(8), pp. 1388-1442 (2013).
Remillard, et al., "A direct comparison of flow-by and flow-through capacitive deionization," Desalination 444, pp. 169-177 (2018).
Ren, et al., "A single-layer Janus membrane with dual gradient conical micropore arrays for self-driving fog collection," Journal of Materials Chemistry A 5, pp. 18403-18408 (2017).
Sasaki, et al., "Asymmetric Superhydrophobic/Superhydrophilic Cotton Fabrics Designed by Spraying Polymer and Nanoparticles," ACS Applied Materials & Interfaces 8(1), pp. 651-659 (2016).
Simon & Gogotsi, "Materials for electrochemical capacitors," Nature Materials 7, pp. 845-854 (2008).
Song, et al., "Anomalous Pseudocapacitive Behavior of a Nanostructured, Mixed-Valent Manganese Oxide Film for Electrical Energy Storage," Nano Letters 12(7), pp. 3483-3490 (2012).
Sugimoto, et al., "Charge storage mechanism of nanostructured anhydrous and hydrous ruthenium-based oxides," Electrochimica Acta 52(4), pp. 1742-1748 (2006).
Sugimoto, et al., "Preparation of Ruthenic Acid Nanosheets and Utilization of Its Interlayer Surface for Electrochemical Energy Storage," Angewandte Chemie International Edition 42(34), pp. 4092-4096 (2003).
Suss, et al., "Water desalination via capacitive deionization: what is it and what can we expect from it?," Energy & Environmental Science 8, pp. 2296-2319 (2015).
Tian, et al., "Droplet and Fluid Gating by Biomimetic Janus Membranes," Advanced Functional Materials 24(38), pp. 6023-6028 (2014).
Toupin, et al., "Charge Storage Mechanism of MnO2 Electrode Used in Aqueous Electrochemical Capacitor," Chemistry of Materials 16(16), pp. 3184-3190 (2004).
Ueda, et al., "Effects of aeration on suction pressure in a submerged membrane bioreactor," Water Research 31(3), pp. 489-494 (1997).
Vaha-Nissi, et al., "Growth of thin Al2O3 films on biaxially oriented polymer films by atomic layer deposition," Thin Solid Films 522, pp. 50-57 (2012).
Wang, et al., "Directional water-transfer through fabrics induced by asymmetric wettability," Journal of Materials Chemistry 20, 7938 (2010).
Wang, et al., "Extremely Efficient and Recyclable Absorbents for Oily Pollutants Enabled by Ultrathin-Layered Functionalization," ACS Applied Materials & Interfaces 6(21), pp. 18816-18823 (2014).
Wang, et al., "Rapid and Efficient Separation of Oil from Oil-in-Water Emulsions Using a Janus Cotton Fabric," Angewandte Chemie International Edition 55(4), pp. 1291-1294 (2016).
Wang, et al., "Simply realizing 'water diode' Janus membranes for multifunctional smart applications," Materials Horizons 4, pp. 701-708 (2017).
Wang, et al., "Universal Janus Filters for the Rapid Separation of Oil from Emulsions Stabilized by Ionic or Nonionic Surfactants," Angewandte Chemie International Edition 56(42), pp. 12892-12897 (2017).
Wu, et al., "Janus Membranes with Opposing Surface Wettability Enabling Oil-to-Water and Water-to-Oil Emulsification," ACS Applied Materials & Interfaces 9(6), pp. 5062-5066 (2017).
Wu, et al., "Unidirectional water-penetration composite fibrous film via electrospinning," Soft Matter 8, 5996 (2012).
Xu, et al., "Atomic layer deposition of alumina on porous polytetrafluoroethylene membranes for enhanced hydrophilicity and separation performances," Journal of Membrane Science 415-416, pp. 435-443 (2012).
Xu, et al., "Hydrophilization of porous polypropylene membranes by atomic layer deposition of TiO2 for simultaneously improved permeability and selectivity," Journal of Membrane Science 448, pp. 215-222 (2013).
Yang, et al., "Janus hollow fiber membrane with a mussel-inspired coating on the lumen surface for direct contact membrane distillation," Journal of Membrane Science 523, pp. 1-7 (2017).
Yang, et al., "Janus Membranes with Asymmetric Wettability for Fine Bubble Aeration," Advanced Materials Interfaces 3(9), pp. 1-5 (2016).
Yang, et al., "Janus Membranes: Exploring Duality for Advanced Separation," Angewandte Chemie International Edition 55(43), pp. 13398-13407 (2016).
Yang, et al., "Mussel-inspired modification of a polymer membrane for ultra-high water permeability and oil-in-water emulsion separation," Journal of Materials Chemistry A 2, pp. 10225-10230 (2014).
Yang, et al., "Paper-Based Microfluidic Devices: Emerging Themes and Applications," Analytical Chemistry 89(1), pp. 71-91 (2017).
Zang, et al., "Well-Aligned Cone-Shaped Nanostructure of Polypyrrole/RuO2 and Its Electrochemical Supercapacitor," The Journal of Physical Chemistry C 112(38), pp. 14843-14847 (2008).
Zhang & Barboiu, "Dynameric asymmetric membranes for directional water transport," Chemical Communications 51, pp. 15925-15927 (2015).
Zhang, et al., "Biomimetic multifunctional nanochannels based on the asymmetric wettability of heterogeneous nanowire membranes," Advanced Materials 26(7), pp. 1071-1075 (2014).
Zhang, et al., "Mineralized growth of Janus membrane with asymmetric wetting property for fast separation of a trace of blood," Journal of Materials Chemistry B 5, pp. 4876-4882 (2017).
Zhao, et al., "Directional Fluid Transport in Thin Porous Materials and its Functional Applications," Small 13(4), pp. 1-22 (2017).
Zheng & Yapa, "Bouyant Velocity of Spherical and Nonspherical Bubbles/Droplets," Journal of Hydraulic Engineering 126(11), pp. 852-854 (2000).
Zhou, et al., "Superphobicity/philicityjanus fabrics with switchable, spontaneous, directional transport ability to water and oil fluids," Sci. Rep., 3, pp. 1-6 (2013).
Chen & Xu, "Mineral-Coated Polymer Membranes with Superhydrophilicity and Underwater Superoleophobicity for Effective Oil/Water Separation," Scientific Reports 3, 2776, 6 pages (2013).
Chen, et al., "Bio-inspired CaCO3 coating for superhydrophilic hybrid membranes with high water permeability," Journal of Materials Chemistry 22, pp. 22727-22733 (2012).
Cheryan & Rajagopalan, "Membrane processing of oily streams. Wastewater treatment and waste reduction," Journal of Membrane Science 151(1), pp. 13-28 (1998).
Dudchenko, et al., "Coupling Underwater Superoleophobic Membranes with Magnetic Pickering Emulsions for Fouling-Free Sepa-

(56) References Cited

OTHER PUBLICATIONS ration of Crude Oil/Water Mixtures: An Experimental and Theoretical Study," ACS Nano 9(10), pp. 9930-9941 (2015).
Fakhru'l-Razi, et al., "Review of technologies for oil and gas produced water treatment," Journal of Hazardous Materials 170(2-3), pp. 530-551 (2009).
Gao, et al., "A Robust Polyionized Hydrogel with an Unprecedented Underwater Anti-Crude-Oil-Adhesion Property," Advanced Materials 28(26), pp. 5307-5314 (2016).
Guo, et al., "Robust Underwater Oil-Repellent Material Inspired by Columnar Nacre," Advanced Materials 28(38), pp. 8505-8510 (2016).
Huang & Wang, "A Simple Nanocellulose Coating for Self-Cleaning upon Water Action: Molecular Design of Stable Surface Hydrophilicity," Angewandte Chemie International Edition 56(31), pp. 9053-9057 (2017).
Kota, et al., "Hygro-responsive membranes for effective oil-water separation," Nature Communications 3, 1025, 8 pages (2012).
Kota, et al., "The design and applications of superomniphobic surfaces," NPG Asia Materials 6, e109, 16 pages (2014).
Lee, et al., "Membrane materials for water purification: design, development, and application," Environmental Science: Water Research & Technology 2, pp. 17-42 (2016).
Liu, et al., "Clam's Shell Inspired High-Energy Inorganic Coatings with Underwater Low Adhesive Superoleophobicity," Advanced Materials 24(25), pp. 3401-3405 (2012).
Steele, et al., "Inherently Superoleophobic Nanocomposite Coatings by Spray Atomization," Nano Letters 9(1), pp. 501-505 (2009).
Tao, et al., "An Intelligent Superwetting PVDF Membrane Showing Switchable Transport Performance for Oil/Water Separation," Advanced Materials 26(18), pp. 2943-2948 (2014).
Wang, et al., "PVDF membranes with simultaneously enhanced permeability and selectivity by breaking the tradeoff effect via atomic layer deposition of TiO2," Journal of Membrane Science 442, pp. 57-64 (2013).
Wen, et al., "Zeolite-coated mesh film for efficient oil-water separation," Chemical Science 4, pp. 591-595 (2013).
Xue, et al., "A Novel Superhydrophilic and Underwater Superoleophobic Hydrogel-Coated Mesh for Oil/Water Separation," Advanced Materials 23(37), pp. 4270-4273 (2011).
Yang, et al., "Polymer membrane with a mineral coating for enhanced curling resistance and surface wettability," Chemical Communications 51, pp. 12779-12782 (2015).
Yang, et al., "Silica-Decorated Polypropylene Microfiltration Membranes with a Mussel-Inspired Intermediate Layer for Oil-in-Water Emulsion Separation," ACS Applied Materials & Interfaces 6(15), pp. 12566-12572 (2014).
Zhang, et al., "Cupric Phosphate Nanosheets-Wrapped Inorganic Membranes with Superhydrophilic and Outstanding Anticrude Oil-Fouling Property for Oil/Water Separation," ACS Nano 12(1), pp. 795-803 (2018).
Zhang, et al., "Nanowire-Haired Inorganic Membranes with Superhydrophilicity and Underwater Ultralow Adhesive Superoleophobicity for High-Efficiency Oil/Water Separation," Advanced Materials 25(30), pp. 4192-4198 (2013).
Zhang, et al., "Salt-Induced Fabrication of Superhydrophilic and Underwater Superoleophobic PAA-g-PVDF Membranes for Effective Separation of Oil-in-Water Emulsions," Angewandte Chemie International Edition 53(3), pp. 856-860 (2014).
Zhang, et al., "Superhydrophobic and Superoleophilic PVDF Membranes for Effective Separation of Water-in-Oil Emulsions with High Flux," Advanced Materials 25(14), pp. 2071-2076 (2013).
Chen, et al., "Mineral-Coated Polymer Membranes with Superhydrophilicity and Underwater Superoleophobicity for Effective Oil/Water Separation," Scientific Reports 3:2776, 6 pages (Sep. 2013).
Yang, et al., "Surface and interface engineering for organic-inorganic composite membranes," J. Mater. Chem. A, 4, pp. 9716-9729 (2016).
Afshar & Cadien, "Growth mechanism of atomic layer deposition of zinc oxide: A density functional theory approach," Applied Physics Letters 103(25), 251906, 6 pages (2013).
Kowalik, et al., "Extra-Low Temperature Growth of ZnO by Atomic Layer Deposition with Diethylzinc Precursor," Acta Physica Polonica A 112(2), pp. 401-406 (2007).

* cited by examiner

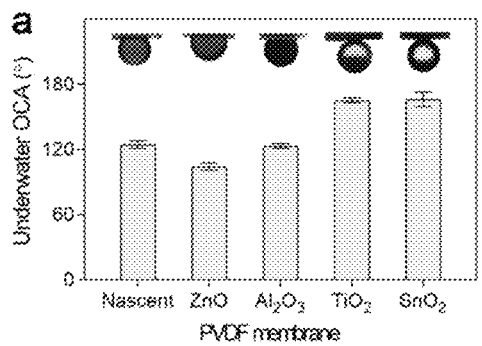
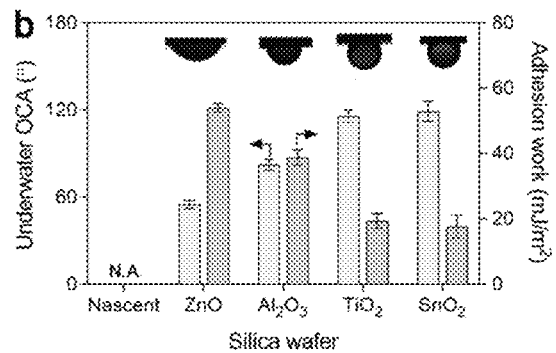
Fig. 5A            Fig. 5B
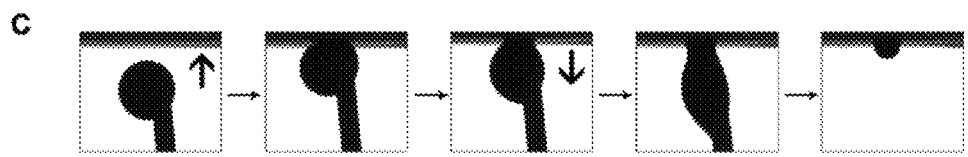
Fig. 5C
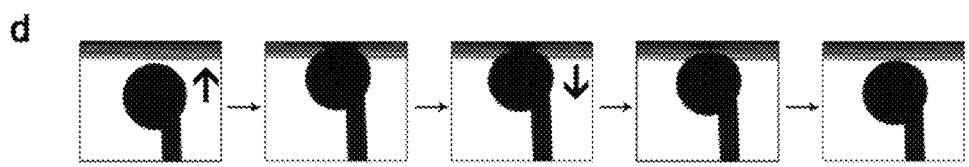
Fig. 5D

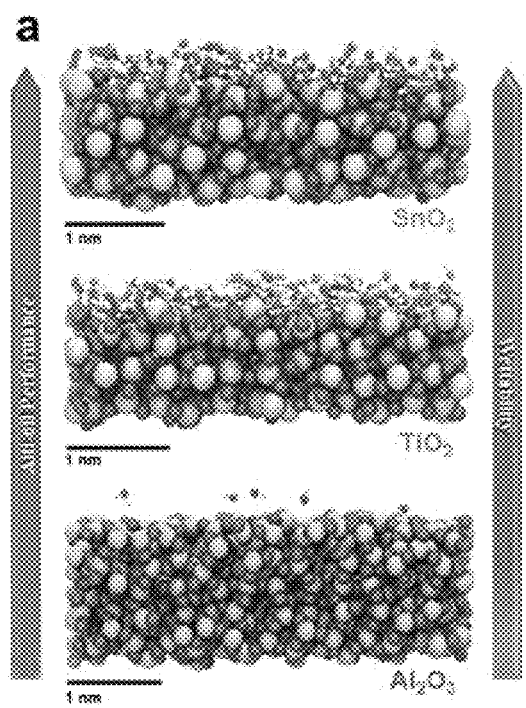
Fig. 8A
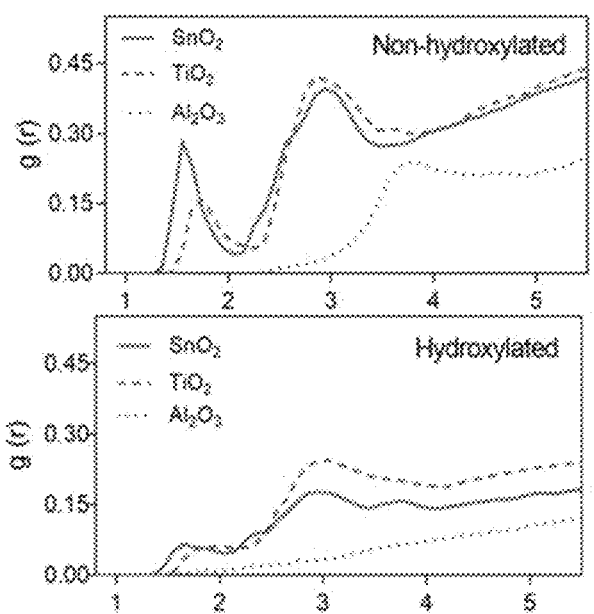
Fig. 8B
Fig. 8C

SYSTEMS AND METHODS FOR OLEOPHOBIC COMPOSITE MEMBRANES

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

TECHNICAL FIELD

The present disclosure relates generally to oil-resistant membranes and methods of fabricating and using the same.

BACKGROUND

Oil and water environments are commonplace in many industrial settings. For example, oily wastewater originates directly as a waste output from various processes or through the use of water to clean-up oil spill accidents and industrial waste. Oily wastewater may also result directly from extraction and refining processes. While hydrocarbons can pose a significant risk, oil, such as crude oil, can particularly pose a significant hazard to the environment and human health. Crude oil includes hydrocarbons of various molecular weights as well as other organic compounds, often varying depending on where the oil is extracted and how it is processed. The high viscosity and complex composition make crude oil extremely sticky to many materials that would be used to treat the wastewater.

While various technologies have been developed to help address oily wastewater, filtration is one of the primary manners in which such wastewater is treated. Recently, membrane technology has been a focus as a possible solution for oily wastewater treatment due to its high separation efficiency and low energy consumption. To that end, membranes have been widely implemented in oilfield wastewater treatment to meet reinjection or discharge standards. While such membranes provide some useful function, they also present a major challenge. The current membranes experience fouling by the oil, often severe fouling by crude oil. The fouling results in a dramatic decline of membrane performance and overall average lifetime.

Some attempts have been made to alter the oil in the wastewater, either by chemically breaking down the oil or by binding the oil to another compound. However, such techniques have failed to satisfactorily avoid fouling such that the membrane is able to provide the desired performance and lifetime.

Another strategy has been to prevent adhesion of the oil to a surface based on surface properties of the membrane. Oil adhesion on a surface is closely related to the surface properties, and an ideal anti-oil surface would be hierarchically structured and fully hydrated. Water trapped in micro- and nano-structures reduces the contact area between oil and solid, and the water on the solid surface serves as a physical barrier to prevent direct oil adhesion. Based on these design principles, many superhydrophilic/underwater-superoleophobic polymer membranes have been developed for oil/water separation. In general, these previously reported membranes are satisfactory for nonpolar solvents or light oils, such as gasoline and diesel fuel, but unfortunately, few if any can resist crude oil. This failure is largely rooted in the flexibility of polymer chains and the concomitant soft surface morphology. Hydrocarbon segments comprising the polymers are oleophilic, so they tend to reorient toward oil at the oil/water interface, and water that may be initially trapped in a soft, rough structure is easily excluded under filtration pressure. Therefore, non-flexible hydrophilic moieties and rigid roughness are favored in constructing a robust and stable anti-oil surface. For example, nanocellulose exhibits superior anti-oil performance relative to polyelectrolytes due to its abundant hydroxyl groups secured to a rigid molecular structure.

Inorganic minerals, such as calcium carbonate in clam shell, are another category of material with rigid rough structure and plenty of hydrophilic moieties on the surface. Such structures can stabilize superoleophobicity even under filtration pressure and cross flow. For instance, Liu, et al., fabricated a hierarchical CuO surface with excellent underwater superoleophobicity by mimicking the surface structure of clam shell. Another work by Guo, et al., presented a nacre-inspired composite surface composed of montmorillonite and hydroxyethyl cellulose with extremely low oil adhesion. Similarly, oil/water separators could be fabricated by growing inorganics such as copper oxide nanowires, cupric phosphate nanosheets and zeolites on steel meshes. Most of them, however, are only realizable on large-pore materials such as meshes, fabrics, and sponges rather than membranes, because using those synthetic methods, minerals aggregate into micron-sized particles (i.e., larger than membrane pores). These separation materials cannot meet the requirements of oilfield wastewater treatment because of their poor rejection of sub-micron contaminants. In addition, the poor compatibility between inorganics and polymers renders realization of conformal and stable mineral coatings on polymer substrates an ongoing challenge. One research group has developed a bio-inspired mineralization strategy to fabricate conformal mineral nanocoatings on polymer microfiltration membranes. A polyacrylic acid or polydopamine/polyethyleneimine interlayer was introduced on the membrane surface for in-situ mineral growth. The interlayer not only promotes the uniformity and stability of mineral coatings, but it also stabilizes their amorphous structure to confine their thickness within several tens of nanometers. Unfortunately, the coating thickness is poorly controlled, and only a few minerals are available by this strategy.

Therefore, there is unmet demand for crude-oil-repellent membranes in the oil and gas industry, among others.

SUMMARY

Some embodiments described herein relate generally to a method of fabricating an oleophobic membrane. The method comprises providing a membrane having a hydrophilic moiety exposed at a surface of at least a first side of the membrane, depositing an oxide coating on the surface of the first side of the membrane by atomic layer deposition by X cycles. The X cycles of atomic layer deposition (ALD) comprise the steps of: performing A atomic layer deposition subcycles of a first ALD precursor at a first deposition temperature; and performing B atomic layer deposition subcycles of a second ALD precursor at a second deposition temperature; where X is greater than 0, A is greater than 0 and B is greater than 0.

Other embodiments relate to a method of fabricating an oleophilic membrane by providing a membrane having a bulk polymer and a hydrophilic additive, the membrane having a first side and a second side and depositing an oxide coating having a strong hydration state on the surface of the first side of the membrane by atomic layer deposition. The ALD comprises the steps of: a) performing atomic layer deposition of a first ALD precursor at a first deposition temperature; b) purging the first ALD precursor with an inert gas; c) performing atomic layer deposition of a second ALD precursor at a second deposition temperature; d) purging the second ALD precursor with an inert gas; and repeating steps a), b), c), and d) until the oxide coating is at least 1-20 nm thick.

Other embodiments relate to an oleophobic membrane. The oleophobic membrane comprises a membrane having pores and comprising a bulk material having a hydrophilic moiety selected from the group consisting of polyvinylidene fluoride (PVDF), polypropylene (PP), polyethylene (PE), polytetrafluoroethylene (PTFE), nylon, cellulose acetate (CA), polyacrylonitrile (PAN), polycarbonate (PC), polyether etherketone (PEEK), polyimide (PI), polysulfone (PS), and polyethersulfone (PES). The oleophobic membrane further comprises an oxide coating conformally disposed on an outer surface of the membrane and within pores of the membrane, the oxide coating selected from the group consisting of $TiO_2$, $SnO_2$. $HfO_2$, $ZrO_2$, $SiO_2$, and $In_2O_3$, wherein the oleophobic membrane has a hydration layer bound to the oxide coating.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 5A is a graph of crude oil contact angles (OCAs) on nascent and oxide-coated PVDF membranes under water. FIG. 5B is a graph of OCAs on oxide-coated silica wafers under water. FIGS. 5C and 5D show the results of a rude oil adhesion test on nascent (FIG. 5C) and $SnO_2$-coated (FIG. 5D) membranes.

FIG. 7A shows the setup for filtration of 2 v/v % crude oil-in-water feed under stirring. FIG. 7B shows the feed and permeate. FIG. 7C is a graph of permeate flux evolution of nascent PVDF and $SnO_2$-coated membranes.

FIG. 8A shows three tested layers and their respective structure and relative anti-oil performance and wettability. FIG. 8B shows a graph of the radial distribution function as a function of distance between molecules demonstrating the underlying molecular dynamics for hydroxylated systems. FIG. 8C shows a graph of the radial distribution function as a function of distance between molecules demonstrating the underlying molecular dynamics for hydroxylated systems.

Figure 1A:
FIG. 1A shows SEM images of membranes coated with ZnO, $Al_2O_3$, $TiO_2$ and $SnO_2$, (left, center, right, respectively)

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to oleophobic coated membranes. As further described herein the oleophobic coating may be applied by ALD.

ALD provides a reliable technology to fabricate conformal coatings on material surfaces. ALD is a chemically diverse vapor-phase deposition technique with the capability to synthesize ultra-thin and pinhole-free films, for example oxide barriers, with well-defined surface chemical control and precise physical thickness. While ALD is essentially a chemical vapor deposition (CVD), it is unique in that it can allow very high control for deposition of extremely thin layers (e.g., less than 1 nm thick layers) on the substrate. One or more precursors, for example gaseous precursors are inserted sequentially into the ALD chamber. The precursors interact in the ALD chamber to layer-by-layer deposit a film, layer or otherwise coating (e.g., a metal oxide) on the substrate positioned in the ALD chamber over numerous insertion cycles. ALD enables layer-by-layer conformal growth. As described herein, the term "conformal" implies that the ALD deposited layer or coating conforms to the contours of structure on which it is deposited. In the case of a porous structure, the deposition occurs on the exposed surface, including within the pores (see, e.g., FIG. 1C). Sequential infiltration synthesis (SIS) is a related deposition technique, similar to ALD in the use of precursor cycles. However, SIS differs notably from ALD in how the materials deposited are located relative to the substrate, where ALD deposited on a surface while SIS deposits in the surface and/or within the bulk of the substrate.

Using ALD, the coating thickness can be precisely tuned at the nanometer scale by adjusting deposition parameters. Described herein are oxide-coated membranes by ALD. Experiments of select oxide-coated membranes are provided to evaluate their anti-crude-oil performance. Notably, oxides from different element groups (i.e., ZnO, $Al_2O_3$, $TiO_2$ and $SnO_2$) exhibited vastly different crude oil repellence: ZnO- and $Al_2O_3$-coated membranes remained as adhesive to crude oil as nascent membranes, while $TiO_2$- and $SnO_2$-coated ones exhibited extraordinary low adhesion to crude oil both under water and in air after wetting by water. As further described herein, it is believed that the differences in anti-oil performance between different deposited oxides relates to the hydration state of the oxides, wherein embodiments described herein relate to oleophobic membranes derived from oxide coatings with a strong hydration state. A strong hydration state is one that forms a tightly bound hydration layer. A hydration layer is the water at the surface of the membrane. As described below in some compounds the hydration state may not be strong and the resultant hydration layer is not a continuous layer but rather partial and discontinuous. This water is bound, for example, by electrostatic attraction.

FIG. 8A shows three tested layers and their respective structure and relative anti-oil performance and wettability. FIG. 8B shows a graph of the radial distribution function as a function of distance between molecules demonstrating the underlying molecular dynamics. The impact on the performance as an oleophobic material varies with wettability, with those materials having higher wettability being superior oleophobic membranes.

The oleophobic membrane includes a membrane and a coating. The membrane may be a typical commercially available membranes in some embodiments. In one embodiment the membrane may be hydrophilic imparted by one or more hydrophilic moieties. At least a portion of the hydrophilic moieties are positioned at the surface of the membrane. The membrane may comprise material selected from an organic polymer, such as PVDF, PP, PE, PTFE, nylon, CA, PAN, PC, PEEK, PI, PS, or PES. For membrane materials comprising a polar moiety, ALD may be performed directly. For membrane materials without a polar moiety, such as PP, PE, and PTFE, pretreatment with a plasma or other processing to enable deposition without the traditional covalent binding of the polar moiety with the first ALD precursor is done. Further, the membrane may be a composite material consisting of bulk membrane material and an additive. Where the additive is hydrophilic, serving as the hydrophilic moiety of the membrane, such as polyvinyl pyrrolidone (PVP), polyethylene glycol (PEG), piperazine, cellulose acetate phthalate (CAP), or malic acid, the membrane bulk may comprise a hydrophobic material (such as PVDF, PP, or PE). Preferably, the membrane is reactive with the selected ALD precursors. For example, one or both of the membrane bulk or the additive may be reactive with the first ALD precursor as described below. In one embodiment, the membrane has a disk shape and a diameter of about 47 mm and a thickness of ~50-100 microns. However, it should be appreciated that the size of the membrane may be scaled. Further, the porous network may vary, with the ALD parameters and pores being selected to at least allow the ALD reaction to occur within the pores by enabling diffusion of the precursors during ALD into the pores.

In one embodiment, a coating is applied to the membrane, including within the pores. The coating may comprise $TiO_2$, $SnO_2$. $HfO_2$, $ZrO_2$, $SiO_2$, or $In_2O_3$. In one embodiment, the coating is $TiO_2$ or $SnO_2$. The coating may be deposited on a portion of the coating, such as one side or a portion of one side or may be deposited on the outer surface such that both sides of the membrane include the coating. The coating may be conformal to the pores, i.e., extending into the pores and coating a sidewall of the pores. Where the pores or coated, they may be coated uniformly throughout or may have a gradient of thickness. In one embodiment, the coating has a thickness of about 1-20 nm (including all-inclusive ranges therein), such as about 10 nm.

In one embodiment, as further described below regarding the ALD methods, the oxide coatings are achieved through the use of a metal ALD precursor (first ALD precursor) and an oxidizing precursor (second metal precursor). For embodiments having a $TiO_2$ coating, the metal precursor may be titanium tetrachloride. For embodiments having a $SnO_2$ coating, the metal precursor may be tetrakis(dimethylamino) tin(IV). In one embodiment, the oxidizing precursor maybe be selected from water, oxygen, ozone, hydrogen peroxide, and combinations thereof. In one embodiment, the coating comprises $SiO_2$ and the first ALD precursor is (N,N-dimethylamino)trimethylsilane) $(CH_3)_3SiN(CH_3)_2$, vinyltrimethoxysilane $CH_2\!=\!CHSi(OCH_3)_3$, trivinylmethoxysilane $(CH_2\!=\!CH)_3SiOCH_3$, tetrakis(dimethylamino)silane $Si(N(CH_3)_2)_4$, or tris(dimethylamino)silane (TDMAS) $SiH(N(CH_3)_2)_3$.

In one embodiment, a method of creating the oleophobic membrane, such as one shown in FIG. 1A, includes ALD deposition of the coating on the membrane. The membrane is positioned in an ALD reactor. The ALD reactor device includes a closed reaction chamber with the membrane positioned therein. As the membrane will typically be comprised of material with a low melting point, the ALD process in some embodiments occurs at a temperature below 170° C. and above 40° C. (including ranges there between), such as below 150° C., below 125° C., between 110° C. and 90° C., at about 80 to 100° C. (+/−2° C.).

ALD proceeds with A subcycles (e.g., 1, 2, 3, 4, 5, 6, 7, 8, 9, 10 cycles or any other suitable subcycles) of a first ALD precursor. In a first ALD precursor subcycle, the first ALD precursor is introduced for a first period of time. The first ALD precursor reacts with the membrane. Specifically, the first ALD precursor diffuses through the reaction chamber and interacts with the surface of the membrane. The first ALD precursor forms a first half-step structure bonded to the membrane. Where an additive has been included in the membrane together with membrane bulk, the first ALD precursor may preferentially bind with one or the other. A plurality of such half-step structure are bonded where the first ALD precursor was exposed to the membrane. Optionally a first inert gas is used to purge the first ALD precursor.

ALD then proceeds with B subcycles (e.g., 1, 2, 3, 4, 5, 6, 7, 8, 9, 10 cycles or any other suitable cycles) of a second ALD precursor. The second ALD precursor is introduced for a second period of time. The second ALD precursor reacts with the first half-step structure to form the coating. Optionally a second inert gas is used to purge the second ALD precursor.

Exposure to the first ALD precursor and then exposure to the second ALD precursor constitute one cycle resulting in deposited oxide material. A cycle may utilize multiple subcycles of first ALD precursor exposure and/or multiple subcycles of second ALD precursor exposure. Subsequent first ALD exposures may result in the first ALD precursor bonding with the coating to form additional layers (by reaction with the second ALD precursor) where the membrane is no longer exposed. An ALD cycle may be repeated (e.g., 10, 20, 30, 40, 50, 60, 70, 80, 90, 100, 140, 180, 200 cycles or any other suitable cycles) to deposit a coating of desired thickness, for example at least a complete coating, i.e., not islands or seeds.

Examples

As non-limiting examples, commercial PVDF membranes were selected as the bulk substrate for the membranes. The PVDF membranes included PVP embedded as a hydrophilic additive which introduces nucleating sites for the ALD process, which would otherwise be challenging on a largely unreactive PVDF substrate. Considering the low thermal stability of polymer membranes, the ALD temperature for all samples was 100° C., much lower than the melting point of PVDF (~170° C.). For this reason, oxides that could form at low temperature with suitable precursors (Table 1) were selected (i.e., ZnO, $Al_2O_3$, $TiO_2$ and $SnO_2$). The number of ALD cycles was selected to achieve a comparable thickness (i.e., ~10 nm) for each of the different oxide coatings.

TABLE 1

Example precursors for different oxides in ALD

| Oxide | Precursor A | Precursor B | ALD cycles |
| --- | --- | --- | --- |
| ZnO | Diethyl zinc (DEZ) | $H_2O$ | 58 |
| $Al_2O_3$ | Trimethyl aluminum (TMA) | $H_2O$ | 77 |
| $TiO_2$ | Titanium tetrachloride (TTC) | $H_2O$ | 100 |
| $SnO_2$ | Tetrakis(dimethylamino) tin(IV) (TDMASn) | $H_2O$ | 78 |

ALD:

PVDF microfiltration membrane (φ 47 mm, mean pore size 200 nm) was purchased from the MilliporeSigma (USA). The precursors, i.e., diethyl zinc (DEZ), trimethyl aluminum (TMA), titanium tetrachloride (TTC), tetrakis(dimethylamino) tin(IV) (TDMASn) were obtained from Sigma-Aldrich (USA). All the chemicals were used as received. ALD was conducted in a in a hot-walled, viscous flow reactor constructed by a circular stainless-steel tube with an internal diameter of 5 cm. All the experiments were performed at 100° C. and the carrier gas is ultrahigh pure (99.999%) nitrogen. The growth rate of oxides was achieved by detecting the thickness of oxide layers on a silica wafer using an ellipsometer. A long dose (5 s) and purge time (40 s) was applied to allow the diffusion of precursors through the entire membrane.

Characterization:

The surface morphologies of membranes were observed by field emission scanning electron microscopy (FE-SEM). All the samples were coated with carbon layers to improve their conductivity. The surface hydrophilicity as well as the underwater oleophobicity was evaluated by water contact angle test system Kruss Drop Shape Analysis System.

Figure 1B:
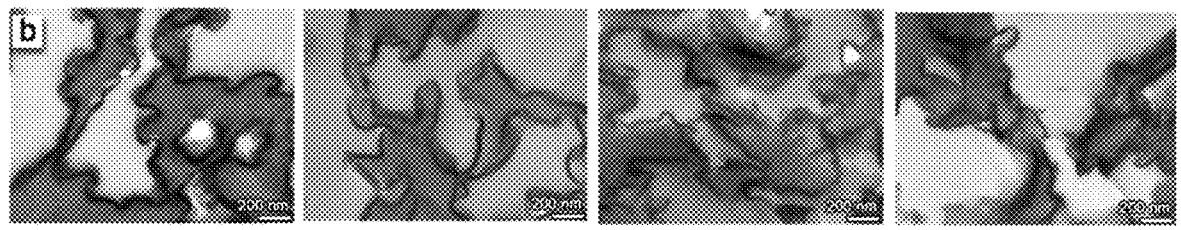
FIG. 1B shows transmission electron microscopy (TEM) images of membranes coated with ZnO, $Al_2O_3$, $TiO_2$ and $SnO_2$, (left, center, right, respectively)
Figure 1C:
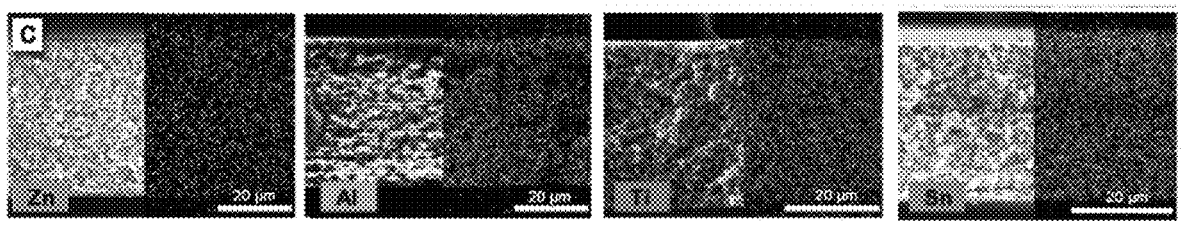
FIG. 1C shows photomicrograph images next to energy dispersive X-ray spectroscopy (EDS) images of cross sections of membranes coated with ZnO, $Al_2O_3$, $TiO_2$ and $SnO_2$, (left, center, right, respectively).
Figure 3:
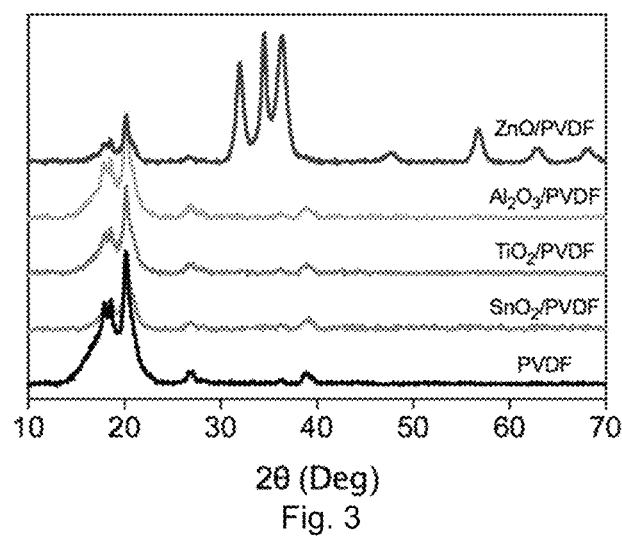
FIG. 3 is a graph of X-ray diffraction (XRD) spectra of nascent and oxide-coated membranes.
Figure 4A:
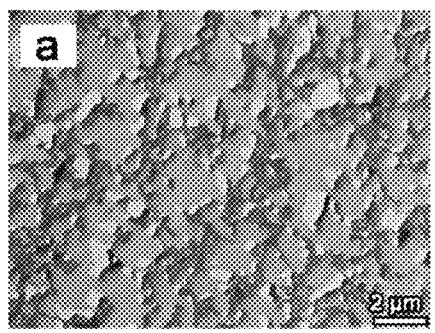
FIGS. 4A-E are TEM images of the slices of membranes in low magnification: nascent (FIG. 4A), ZnO-coated (FIG. 4B), $Al_2O_3$-coated (FIG. 4C), $TiO_2$-coated (FIG. 4D), and $SnO_2$-coated membranes (FIG. 4E).
Figure 4B:
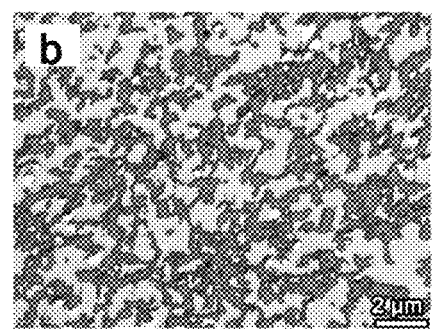
Figure 4C:
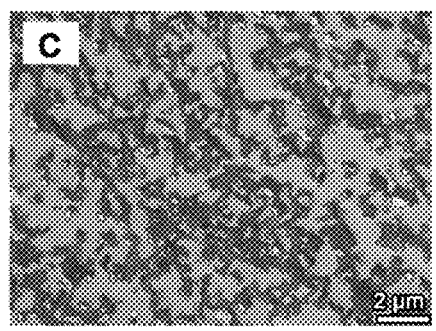
Figure 4D:
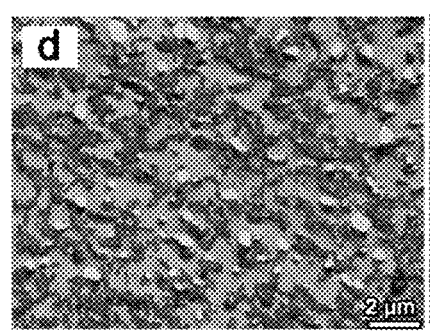
Figure 4E:
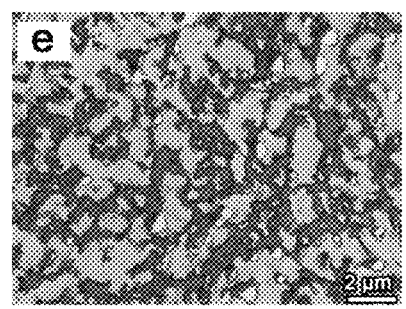
Figure 6A:
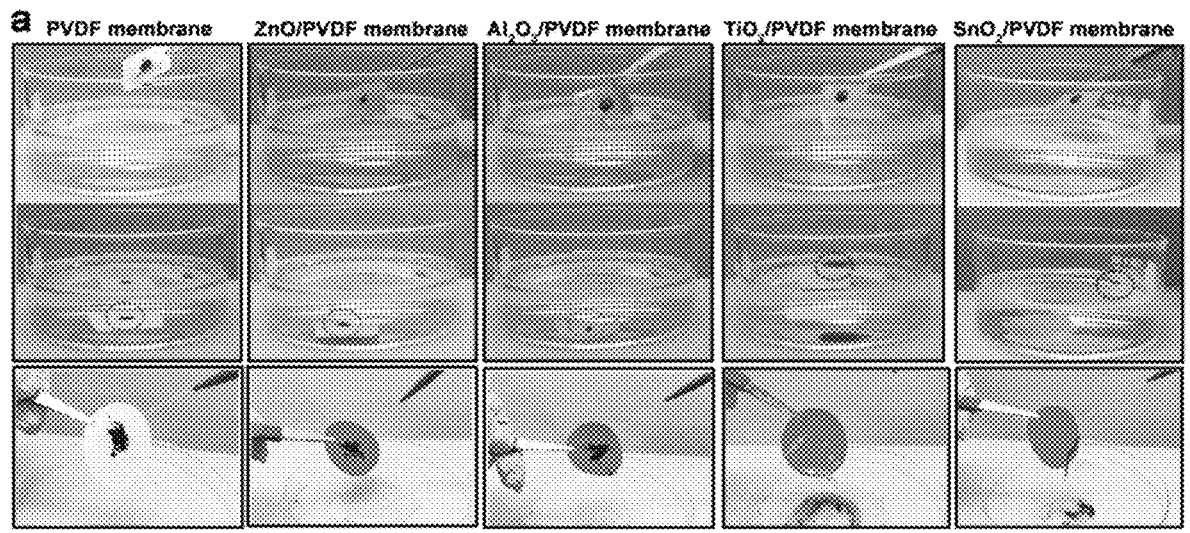
FIG. 6A shows photographs of a demonstrative experiment of crude oil adhesion on nascent and oxide-coated PVDF membranes.
Figure 6B:
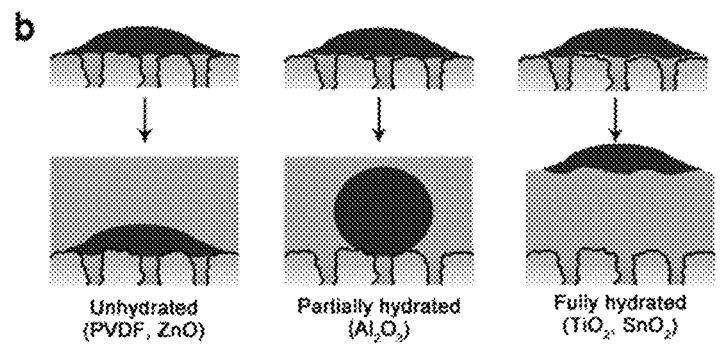
FIG. 6B is an illustration of speculated mechanisms for crude oil adhesion on or departure from the membrane surfaces.
Figure 6C:
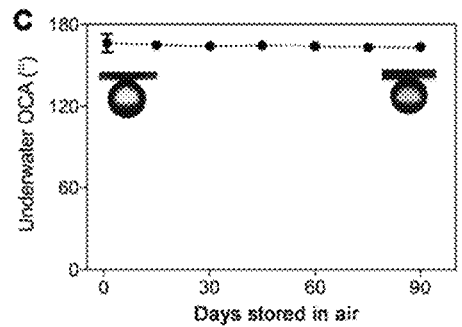
FIG. 6C shows underwater OCAs on $SnO_2$-coated membranes after long-term storage in air.
Figure 7A:
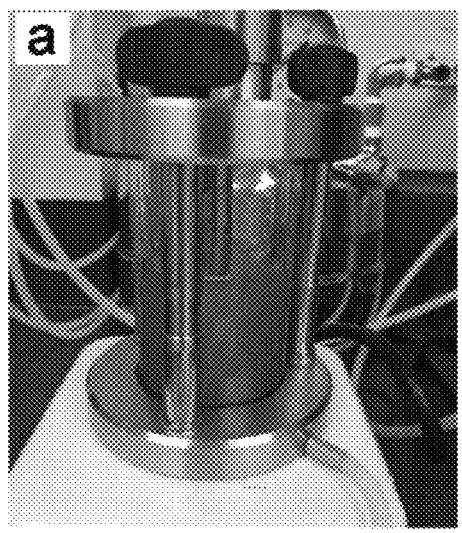
FIGS. 7A-C show the results of an experiments for crude oil filtration.
Figure 7B:
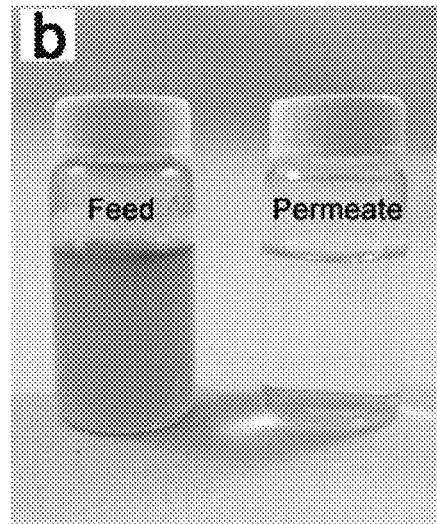
Figure 7C:
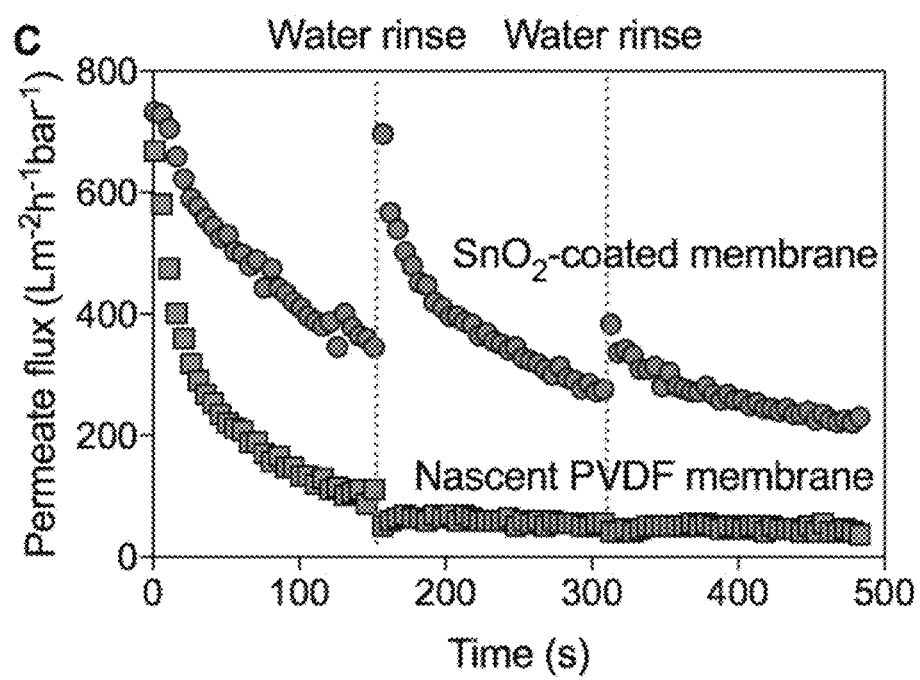

Surface morphology has a significant impact on surface wettability according to the Cassie-Baxter and Wenzel models. The surface structure of nascent and oxide-coated membranes by FE-SEM were as shown in FIG. 1A. The initial PVDF membrane is a commercial product fabricated by phase inversion. These membranes have an irregular and bicontinuous porous structure with smooth solid surfaces. As mentioned above, PVP was embedded in the membrane as a hydrophilic additive, and its polar moieties could interact with vapor-phase precursors for nucleation during ALD. Compared with the nascent membranes, the $Al_2O_3$- and $SnO_2$-coated membranes show no obvious changes in surface morphology, while significant increase in surface roughness can be observed on $TiO_2$- and ZnO-coated membranes, attributed to the different nucleation processes on the membrane surface. All deposited oxides are amorphous except ZnO (FIG. 3) where the crystalline nature of the ZnO can be seen. If solely considering the surface structure, ZnO and $TiO_2$ would be expected to have superior anti-oil property because the micro-nano composite structure could minimize the direct contact area between oil and membrane and promote surface oleophobicity under water. The TEM images of the membrane slices demonstrate that a uniform and conformal coating formed on membrane surface for all the oxides (FIG. 1B), and the EDS spectra of membrane cross-sections also indicate a uniform distribution of oxide across the entire membrane (FIG. 1C).

Figure 2:
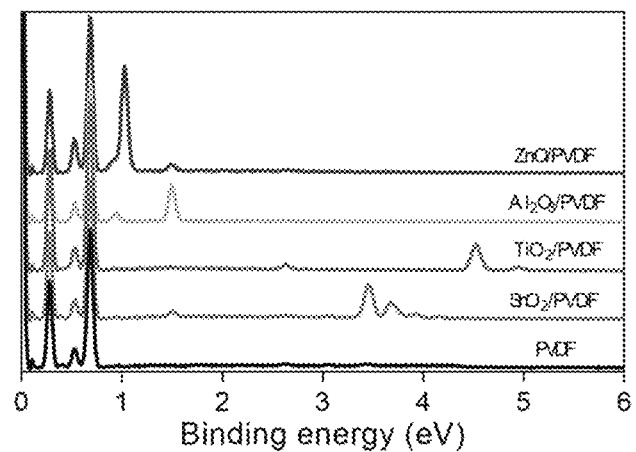
FIG. 2 is a graph of EDS spectra of nascent and oxide-coated membranes.

To evaluate the surface wettability of membranes, the water contact angles (WCAs) and underwater OCAs were detected on each membrane surface. Because of the existence of PVP additive, the nascent membranes are moderately hydrophilic and a water drop can gradually penetrate through due to the capillary effect of the porous structure. The membrane surface became substantially more hydrophilic following ALD treatment. Water drops permeate through the membranes far more rapidly after coating with $TiO_2$ or $SnO_2$. However, water droplets permeate more rapidly (compared to nascent) for ZnO or $Al_2O_3$ but less than $TiO_2$ or $SnO_2$ coated. The hydrophilicity is closely related to the underwater oleophobicity. The underwater OCAs were detected by using crude oils with low and high viscosity (FIG. 2A). All the membranes, including the nascent one, are oleophobic underwater because of their hydrophilicity (or high surface energy) in air. Crude oils are sticky to the nascent, ZnO-coated, and $Al_2O_3$-coated membranes. The nascent membrane shows an OCA of 124.8±3.5°, and the ZnO- and $Al_2O_3$-coated membranes perform similarly or even less oleophobic (OCAs of 104.4±3.4° and 123.5±2.2°, respectively). In contrast, both $TiO_2$- and $SnO_2$-coated membranes show an OCA above 160°, indicating the superoleophobicity of their surfaces. In general a superoleophobic surface can reduce the contact area between surface and oil to lower oil adhesion. It is believed that an OCA of approximately 140° for is necessary for superoleophobicity in a porous surface and 100° is necessary for superoleophobicity for a flat surface. To separate the influences of membrane structure on OCAs, we also measured the underwater OCAs on silica wafers coated with the same oxides (FIG. 2B). The underwater OCAs on flat surfaces decrease significantly, and follow an order of $SnO_2$>$TiO_2$>$Al_2O_3$>ZnO. Specifically, the OCA on ZnO surface decreases to 54.9±2.7°, lying in the oleophilic region, while $TiO_2$ and $SnO_2$ surfaces remain oleophobic with an OCA of 115.8±4.3° and 119.2±6.9°, respectively. It is believed that, due to the membrane surface comprising of polymer skeleton and pores the oil contacts with both oxide surface and water (in pores). This can further decrease the contact area. In the case of silica, all the contact regions are oil/oxide interfaces.

As show in FIG. 2B, the underwater adhesion work was also calculated, based on the following equation: $W=\gamma(1+\cos\theta)$, in which $\gamma$ is the interfacial tension between crude oil and water, and $\theta$ is the underwater OCA on the surface. The $SnO_2$ surface shows the lowest adhesion work of 17.64±2.90 $mJ/m^2$ as expected. These results indicate the intrinsic hydrophilicity (or hydration state) of oxides represents a larger contribution to the surface oleophobicity underwater relative to surface roughness. In another experiment, an extremely sticky crude oil was applied for a dynamic adhesion test. No adhesion or deformation was observed when the oil droplet was pushed toward or pull away from the $SnO_2$-coated membrane in water.

Wetting and adhesion of crude oil on a surface are closely related to the surrounding environment. A hydrophilic surface always has oleophobicity in water but oleophilicity in air. Therefore, we investigated the crude oil adhesion on membrane surfaces both under water and in air. In the first experiment, the membranes were fouled by high-viscosity crude oil in air and then immersed in water (FIG. 3A). Membranes were prewetted by water before contacting crude oil, because the anti-oil property arises from the hydration layer. Crude oil stayed on nascent and ZnO-coated membranes without obvious change after immersing in water, while it departed readily from the surface in the case of $TiO_2$- and $SnO_2$-coated membranes. For the $Al_2O_3$-coated membrane, crude oil deformed to a sphere with a large OCA but remained on the membrane surface. This is a result of the balance among buoyancy, surface tension, and adhesion force in an aqueous environment. A speculated mechanism is depicted in FIG. 3B. In the case of nascent and ZnO-coated membranes, the hydration layer is unstable, which therefore cannot prevent contact between crude oil and the membrane surface in air. When immersing membranes in water, water molecules cannot insert themselves between the adhered crude oil and the membrane surface. On the other hand, the hydration layer is tightly bonded on $TiO_2$ and $SnO_2$ surfaces, which forbids direct contact between oil and surface, and crude oil easily detaches from the surface due to the ultra-low adhesion and buoyancy of oil. For the $Al_2O_3$-coated membrane, the surface is partially hydrated when contacting crude oil, resulting in moderate oil adhesion. To exclude buoyancy itself as a major reason underlying the anti-oil property, we conducted another experiment to rinse the crude-oil-fouled membrane by water in air instead of immersing them in water. As shown in FIG. 3A, crude oil on $TiO_2$ and $SnO_2$-coated membranes was easily washed off whereas it stayed insistently on nascent, ZnO-coated, and $Al_2O_3$-coated membranes. Stability of anti-oil properties during long-term storage is another important issue for these membranes. Surfaces modified by hydrophilic polymers always suffer from hydrophobicity recovery during storage due to chain rearrangement to minimize the surface energy in air. In contrast, oxide-coated membranes shows stable superoleophobicity after long-term (three-month) storage in air because of their rigid hydrophilic groups.

Because of its excellent anti-oil properties, $SnO_2$-coated membranes were applied in practical oily wastewater filtration experiments. Flux evolution over time will reflect the degree of fouling on the membrane surface. For comparison the flux of nascent membranes was also determined (FIG. 4). The concentration of crude oil in water is 2 v/v %, and vigorous stirring was applied to simulate the dynamic filtration process. Both types of membranes exhibited similar initial flux of ~700 $Lm^{-2}h^{-1}bar^{-1}$. The permeate flux of the nascent membrane, however, decreased sharply to ~50 $Lm^{-2}h^{-1}bar^{-1}$ due to severe membrane fouling. In contrast, the $SnO_2$-coated membrane showed slower and less pronounced decrease in permeate flux, and even this moderate decrease is likely attributable to pore blocking during dead-filtration rather than fouling per se. Moreover, no flux recovery was observed for the nascent membrane upon cleaning, while the flux was nearly completely recovered for the $SnO_2$-coated membrane after the first rinsing by water. The flux of the $SnO_2$-coated membrane eventually decreased irreversibly after several cycles, but its flux was still much higher than that of the nascent one after a similar period, indicating substantial improvement in anti-crude-oil performance.

Definitions

As used herein, the singular forms "a", "an" and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method of fabricating an oleophobic membrane comprising:
    providing a membrane comprising a bulk material selected from the group of hydrophobic materials consisting of polyvinylidene fluoride (PVDF) and a hydrophilic additive comprising polyvinyl pyrrolidone (PVP) the membrane having a hydrophilic moiety exposed at a surface of at least a first side of the membrane, and depositing an oxide coating selected from the group consisting of $SiO_2$, $TiO_2$ or $SnO_2$ on the surface of the first side of the membrane by atomic layer deposition by X cycles of the steps of:
- performing A atomic layer deposition subcycles of a first ALD precursor at a first deposition temperature, wherein the first ALD precursor binds with the hydrophilic moiety; and
- performing B atomic layer deposition subcycles of a second ALD precursor at a second deposition temperature;
- where X is greater than 0, A is greater than 0 and B is greater than 0;

wherein a second side of the membrane, opposite the first side of the membrane, remains uncoated by the oxide coating.

2. The method of claim 1, wherein the first temperature and the second temperature are less than 150° C.

3. The method of claim 1, wherein the coating comprises $TiO_2$ and the first ALD precursor is titanium tetrachloride and wherein the second ALD precursor is water.

4. The method of claim 1, wherein the coating comprises $SnO_2$ and the first ALD precursor is tetrakis(dimethylamino)tin(IV) and wherein the second ALD precursor is water.

5. The method of claim 1, further comprising exposing the coated membrane to liquid water and forming a hydration layer adjacent the oxide coating.

6. The method of claim 1, wherein the membrane includes a plurality of pores and further wherein the oxide coating extends into the plurality of pores.

7. A method of fabricating an oleophobic membrane comprising:
providing a membrane having a bulk hydrophobic polymer and a hydrophilic additive selected from the additive group consisting of polyvinyl pyrrolidone (PVP), polyethylene glycol (PEG), piperazine, cellulose acetate phthalate (CAP), or malic acid, the membrane having a first side and a second side, depositing an oxide coating directly on a first side of the membrane, binding with the hydrophilic additive, comprising an oxide selected from the group consisting of $TiO_2$ and $SnO_2$ by atomic layer deposition at a temperature less than 125° C. by the steps of:
a) performing atomic layer deposition of a first ALD precursor at a first deposition temperature, wherein the first ALD precursor binds with the hydrophilic moiety;
b) purging the first ALD precursor with an inert gas;
c) performing atomic layer deposition of a second ALD precursor at a second deposition temperature;
d) purging the second ALD precursor with an inert gas; and
repeating steps a), b), c), and d) until the oxide coating is at least 1-20 nm thick;

wherein a second side of the membrane, opposite the first side of the membrane, remains uncoated by the oxide coating.

8. The method of claim 7, wherein the coating comprises $TiO_2$ or $SnO_2$.

9. The method of claim 7, wherein the coating comprises $TiO_2$ and the first ALD precursor is titanium tetrachloride and wherein the second ALD precursor is water.

10. The method of claim 7, wherein the coating comprises $SnO_2$ and the first ALD precursor is tetrakis(dimethylamino)tin(IV) and wherein the second ALD precursor is water.

11. The method of claim 7, further comprising exposing the coated membrane to liquid water and forming a hydration layer adjacent the oxide coating.

\* \* \* \* \*